(12) United States Patent
Kamizuru et al.

(10) Patent No.: US 11,973,314 B2
(45) Date of Patent: Apr. 30, 2024

(54) LIGHT-SOURCE DRIVE DEVICE AND LIGHT-EMITTING DEVICE

(71) Applicant: SONY SEMICONDUCTOR SOLUTIONS CORPORATION, Kanagawa (JP)

(72) Inventors: Hayato Kamizuru, Kanagawa (JP); Katsuhisa Daio, Kanagawa (JP); Takeshi Yuwaki, Kanagawa (JP); Akihito Kamiegawa, Kanagawa (JP); Naoki Masumitsu, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 547 days.

(21) Appl. No.: 17/275,187

(22) PCT Filed: Aug. 23, 2019

(86) PCT No.: PCT/JP2019/033013
§ 371 (c)(1),
(2) Date: Mar. 10, 2021

(87) PCT Pub. No.: WO2020/059420
PCT Pub. Date: Mar. 26, 2020

(65) Prior Publication Data
US 2021/0328404 A1    Oct. 21, 2021

(30) Foreign Application Priority Data
Sep. 21, 2018    (JP) .................................. 2018-177095

(51) Int. Cl.
*H01S 5/0683*    (2006.01)
*G01S 17/89*    (2020.01)

(52) U.S. Cl.
CPC ............ *H01S 5/0683* (2013.01); *G01S 17/89* (2013.01)

(58) Field of Classification Search
None
See application file for complete search history.

(56) References Cited

U.S. PATENT DOCUMENTS 10,069,275 B1 *   9/2018   Lee ..................... H01S 5/02208
2003/0026304 A1 *   2/2003   Lee ..................... H01S 5/02257
                                                        372/36

(Continued)

FOREIGN PATENT DOCUMENTS

CN       109311121 A       2/2019
DE    102016104946 A1      9/2017

(Continued)

OTHER PUBLICATIONS

International Search Report and Written Opinion of PCT Application No. PCT/JP2019/033013, dated Nov. 19, 2019, 19 pages of ISRWO.

*Primary Examiner* — Tuan N Nguyen
(74) *Attorney, Agent, or Firm* — CHIP LAW GROUP (57) ABSTRACT

An abnormality of output laser light is detected for enhancement in safety. A light-source drive device includes a light-source control unit, a light-receiving unit, and an abnormality detection unit. The light-source control unit included in the light-source drive device controls light emission of a light source. The light-receiving unit included in the light-source drive device receives light from the light source through an output part allowing outward output of light of the light source. The abnormality detection unit included in the light-source drive device detects an abnormality of the light output from the output part, on the basis of the received light.

12 Claims, 8 Drawing Sheets (56) References Cited

U.S. PATENT DOCUMENTS

| | | | |
|---|---|---|---|
| 2016/0069819 A1* | 3/2016 | Ichikawa | F21S 41/16 250/208.2 |
| 2017/0280031 A1 | 9/2017 | Price et al. | |
| 2019/0131767 A1 | 5/2019 | Lee et al. | |
| 2019/0148908 A1 | 5/2019 | Halbritter | |
| 2019/0195440 A1 | 6/2019 | Sato | |

FOREIGN PATENT DOCUMENTS

| | | |
|---|---|---|
| JP | 2004-111859 A | 4/2004 |
| JP | 2013-168586 A | 8/2013 |
| JP | 2014-11278 A | 1/2014 |
| JP | 2014-93396 A | 5/2014 |
| JP | 2017-108009 A | 6/2017 |
| JP | 2018-133435 A | 8/2018 |
| JP | 2019-512170 A | 5/2019 |
| JP | 2019-114706 A | 7/2019 |
| KR | 10-1853268 B1 | 5/2018 |
| WO | 2017/158005 A1 | 9/2017 |
| WO | 2017/165335 A1 | 9/2017 |
| WO | 2019/083066 A1 | 5/2019 |

\* cited by examiner

LIGHT-SOURCE DRIVE DEVICE AND LIGHT-EMITTING DEVICE

CROSS REFERENCE TO RELATED APPLICATIONS

This application is a U.S. National Phase of International Patent Application No. PCT/JP2019/033013 filed on Aug. 23, 2019, which claims priority benefit of Japanese Patent Application No. JP 2018-177095 filed in the Japan Patent Office on Sep. 21, 2018. Each of the above-referenced applications is hereby incorporated herein by reference in its entirety.

TECHNICAL FIELD

The present disclosure relates to a light-source drive device and a light-emitting device. The present disclosure relates particularly to a light-source drive device and a light-emitting device for output of laser light.

BACKGROUND ART

Conventionally, in a laser-light emitting device that radiates output light from a laser diode into space through an optical system, used is a device that enhances the safety for eyes. For example, used is a device that controls current to a laser diode with a photodiode monitoring output light from the laser diode through an optical system (for example, refer to Patent Document 1).

CITATION LIST

Patent Document

Patent Document 1: Japanese Patent Application Laid-Open No. 2004-111859

SUMMARY OF THE INVENTION

Problems to be Solved by the Invention

According to the conventional technology, as a problem, it is difficult to detect an abnormality of output laser light due to, for example, damage in the optical system.

The present disclosure has been made in consideration of the problem, and an object of the present disclosure is to achieve detection of an abnormality of output laser light for enhancement in safety.

Solutions to Problems

The present disclosure has been made in order to solve the problem. A first aspect of the present disclosure is a light-source drive device including: a light-source control unit configured to control light emission of a light source; a light-receiving unit configured to receive light from the light source through an output part allowing outward output of light of the light source; and an abnormality detection unit configured to detect an abnormality of the light output from the output part, on the basis of the received light.

Furthermore, in the first aspect, the abnormality detection unit may detect the abnormality during the light emission of the light source by the light-source control unit.

Furthermore, in the first aspect, the abnormality detection unit may detect the abnormality in a case where a quantity of the received light exceeds a predetermined threshold.

Furthermore, in the first aspect, the abnormality detection unit may detect the abnormality in a case where a quantity of the received light falls below the predetermined threshold.

Furthermore, in the first aspect, the abnormality detection unit may detect the abnormality when the light emission of the light source is stopped by the light-source control unit.

Furthermore, in the first aspect, the abnormality detection unit may detect the abnormality in a case where a quantity of the received light exceeds a predetermined threshold.

Furthermore, in the first aspect, the abnormality detection unit may cause the light-source control unit to stop the light emission when the abnormality is detected.

Furthermore, in the first aspect, the light-receiving unit may receive the light from the light source reflected from the output part.

Furthermore, in the first aspect, the light-receiving unit may receive the light from the light source transmitted through the output part.

Furthermore, in the first aspect, a plurality of the light-receiving units may be further provided, and the abnormality detection unit may detect the abnormality, on the basis of the light received by the plurality of light-receiving units.

Furthermore, a second aspect of the present disclosure is a light-emitting device including: a light source; an output part allowing outward output of light of the light source; a light-source control unit configured to control light emission of the light source; a light-receiving unit configured to receive light from the light source through the output part; and an abnormality detection unit configured to detect an abnormality of the light output from the output part, on the basis of the received light.

Furthermore, in the second aspect, the output part may transmit the light from the light source through the output part and may convert the light from the light source into diffused light.

Adoption of such aspects enables reception of laser light through the output part. Detection of abnormality in the light source or the output part is conceivable.

MODE FOR CARRYING OUT THE INVENTION

Modes for carrying out the present disclosure (hereinafter, referred to as embodiments) will be described below with reference to the drawings. In the following drawings, the same parts or similar parts are denoted with the same reference signs or similar reference signs. Note that the drawings are schematic and thus, for example, the ratio of dimensions of each constituent does not necessarily agree with the reality. Needless to say, there are parts different in the relationship or ratio of dimensions between mutual drawings. Furthermore, the embodiments will be described in the following order.

1. First Embodiment
2. Second Embodiment
3. Third Embodiment
4. Fourth Embodiment
5. Fifth Embodiment
6. Sixth Embodiment
7. Application to Camera

1. First Embodiment

[Light-Emitting Device]

Figure 1:
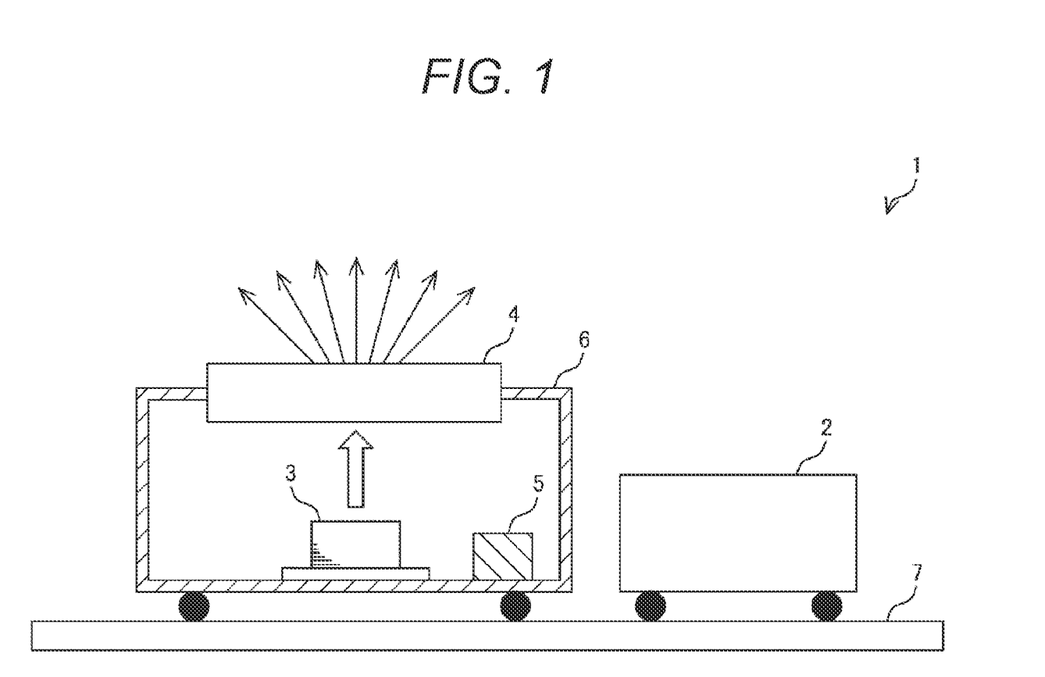
FIG. 1 illustrates an exemplary configuration of a light-emitting device according to a first embodiment of the present disclosure.

FIG. 1 illustrates an exemplary configuration of a light-emitting device according to a first embodiment of the present disclosure. FIG. 1 is a schematic view of the light-emitting device 1. The light-emitting device 1 of FIG. 1 includes a light source 3, an output part 4, a light-receiving unit 5, a housing 6, a drive circuit 2, and a substrate 7. The light-emitting device 1 is used for a device in, for example, a camera or the like that measures the distance to a subject with a time of flight (ToF) technique. Here, the ToF technique is a technique of irradiating a subject with laser light and measuring the time of travel of the laser light to and from the subject to measure the distance.

The light source 3 is disposed in the housing 6 and emits laser light. The output part 4 is disposed at the top of the housing 6. The output part 4 protects the light source 3 and also transmits the laser light therethrough. Furthermore, the output part 4 has a diffuser, to be described later, disposed thereon and converts the laser light into diffused light. The output part 4 converts point-emitting (one-dimensional) laser light to surface-emitting (two-dimensional) laser light. A subject is irradiated with the surface-emitting laser light. The laser light reflected from the subject is captured by an image pickup element, and also distance information is acquired from each pixel in the image pickup element. Thus, three-dimensional mapping of the subject can be performed. The solid-white arrow of FIG. 1 indicates laser light that the light source 3 emits, and the solid-line arrows of FIG. 1 indicate the laser light converted into diffused light by the output part 4.

Because the laser light is high in energy density, direct irradiation of a human body, such as eyeballs, with the laser light is highly likely to cause a disorder on the human body. Thus, required is a safety device that detects abnormality in the light-emitting device 1, such as an output abnormality of laser light from the light source 3 or a direct output of laser light due to detachment of the diffuser from the output part 4, and stops the light source 3 from emitting the laser light. In the housing 6, the light-receiving unit 5 that receives the laser light reflected from the output part 4 is also disposed. As described later, abnormality in the light-emitting device 1 can be detected on the basis of the received laser light.

The drive circuit 2 is an electronic circuit that drives the light source 3 and also detects abnormality in the light-emitting device 1. The drive circuit 2 and the housing 6 are implemented on the substrate 7. Note that the drive circuit 2 includes a light-source control unit 120 and an abnormality detection unit 130, to be described later.

[Configuration of Light-Emitting Device]

Figure 2:
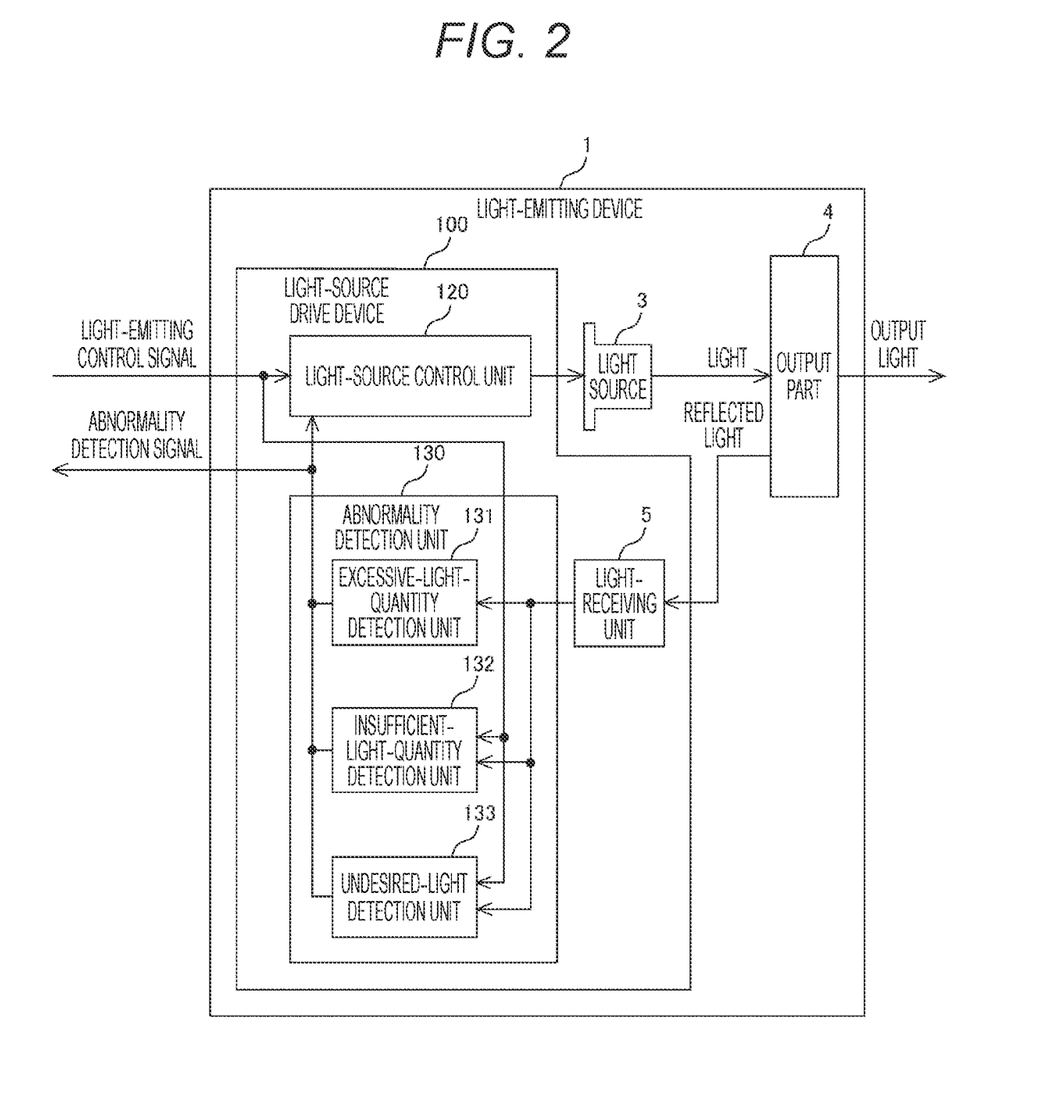
FIG. 2 is a block diagram of an exemplary configuration of the light-emitting device according to the first embodiment of the present disclosure.

FIG. 2 is a block diagram of an exemplary configuration of the light-emitting device according to the first embodiment of the present disclosure. The light-emitting device 1 of FIG. 2 includes the light source 3, the output part 4, and a light-source drive device 100.

The light source 3 emits light. The light source 3 includes, for example, a laser diode and emits laser light.

The output part 4 transmits the laser light from the light source 3 through the output part 4 such that the laser light from the light source 3 is output outward from the light-emitting device 1. Furthermore, the output part 4 converts the laser light into diffused light at the time of output. For the output part 4, for example, used can be a diffuser including glass having a minutely uneven surface.

The light-source drive device 100 drives the light source 3. Furthermore, the light-source drive device 100 detects the abnormality in the light-emitting device 1. The light-source drive device 100 includes the light-receiving unit 5, the light-source control unit 120, and the abnormality detection unit 130.

The light-receiving unit 5 receives the laser light from the light source 3 through the output part 4. In FIG. 2, the light-receiving unit 5 receives the laser light reflected from the output part 4. The light-receiving unit 5 can include, for example, a light-receiving diode, and can output an electric signal corresponding to the received laser light.

The light-source control unit 120 controls light emission of the light source 3. The light-source control unit 120 controls light emission of the light source 3 and stopping of the light emission, on the basis of a light-emitting control signal input from an external control circuit in, for example, a camera in which the light-emitting device 1 is used. For example, in response to input of the light-emitting control signal giving an instruction for output of laser light, the light-source control unit 120 supplies drive current to the laser diode included in the light source 3, so that the light source 3 can emit light. Meanwhile, in response to input of the light-emitting control signal giving an instruction for stopping the output of the laser light, the light-source control unit 120 stops supplying the drive current to the laser diode, and can stop the light emission of the light source 3. Furthermore, at the time of input of an abnormality detection signal, to be described later, from the abnormality detection unit 130, the light-source control unit 120 stops the light emission of the light source 3.

The abnormality detection unit 130 detects the abnormality in the light-emitting device 1, on the basis of the laser light received by the light-receiving unit 5. Specifically, the abnormality detection unit 130 detects an abnormality of the laser light that is output from the output part 4. In response to detection of abnormality, the abnormality detection unit 130 generates an abnormality detection signal and outputs the abnormality detection signal not only to the light-source control unit 120 but also to, for example, the external control circuit. The abnormality detection unit 130 of FIG. 2 includes an excessive-light-quantity detection unit 131, an insufficient-light-quantity detection unit 132, and an undesired-light detection unit 133.

The excessive-light-quantity detection unit 131 detects whether or not the quantity of laser light emitted from the light source 3 is excessive. In a case where the laser light received by the light-receiving unit 5 exceeds a predetermined threshold, the excessive-light-quantity detection unit 131 can detect the abnormality. Specifically, the excessive-light-quantity detection unit 131 compares a signal output from the light-receiving unit 5 with the predetermined threshold, and can output an abnormality detection signal in a case where the signal from the light-receiving unit 5 is higher than the predetermined threshold. When a quantity of laser light exceeding a prescribed quantity is emitted from the light source 3, an excessive quantity of output light is output from the light-emitting device 1. In such a case, the excessive-light-quantity detection unit 131 detects the abnormality. Furthermore, in a case where damage occurs in the output part 4 or an abnormality occurs in attachment angle, the excessive-light-quantity detection unit 131 can detect the abnormality. This is because the quantity of received light increases in the light-receiving unit 5 with an increase in the reflected light from the output part 4.

The insufficient-light-quantity detection unit 132 detects whether or not the quantity of laser light reflected from the output part 4 is insufficient during light emission of the light source 3. In a case where the laser light received by the light-receiving unit 5 falls below a predetermined threshold, the insufficient-light-quantity detection unit 132 can detect the abnormality. Specifically, with the light-emitting control signal giving an instruction for output of laser light, the insufficient-light-quantity detection unit 132 compares a signal output from the light-receiving unit 5 with the predetermined threshold, and can output an abnormality detection signal in a case where the signal from the light-receiving unit 5 is lower than the predetermined threshold. In a case where a fault occurs in the output part 4, such as damage in the output part 4 or detachment from the housing 6, the laser light reflected from the output part 4 decreases. Furthermore, due to, for example, aging degradation, the quantity of laser light from the light source 3 drops. In such a case, the insufficient-light-quantity detection unit 132 detects the abnormality.

The undesired-light detection unit 133 detects whether or not the laser light has been emitted from the light source 3 when the light emission of the light source 3 is stopped by the light-source control unit 120. With the light-emitting control signal giving an instruction for stopping the output of the laser light, the undesired-light detection unit 133 compares a signal output from the light-receiving unit 5 with a predetermined threshold, and can output an abnormality detection signal in a case where the signal from the light-receiving unit 5 is higher than the predetermined threshold. In the period of stopping the light emission of the light source 3, the light emission of the light source 3 due to, for example, a fault of the light-source control unit 120 is detected. Therefore, undesired light can be prevented from being output from the light-emitting device 1.

As above, the excessive-light-quantity detection unit 131 and the insufficient-light-quantity detection unit 132 detect the abnormality during light emission of the light source 3 by the light-source control unit 120. In contrast to this, the undesired-light detection unit 133 detects the abnormality when the light emission of the light source 3 is stopped by the light-source control unit 120. For example, the abnormality detection signals generated by the excessive-light-quantity detection unit 131, the insufficient-light-quantity detection unit 132, and the undesired-light detection unit 133 can be input to the light-source control unit 120 in wired OR connection.

As described above, the light-source drive device 100 according to the first embodiment of the present disclosure receives light from the light source 3 through the output part 4, and thus, can detect the abnormality in the light-emitting device 1.

2. Second Embodiment

The light-source drive device 100 according to the first embodiment detects abnormality in the output part 4, on the basis of the laser light received by the light-receiving unit 5. In contrast to this, a light-source drive device 100 according to a second embodiment of the present disclosure is different from that according to the first embodiment in that further detection of abnormality in an output part 4 is performed on the basis of a signal from a damage detection pattern formed on the output part.

[Configuration of Light-Emitting Device]

Figure 3:
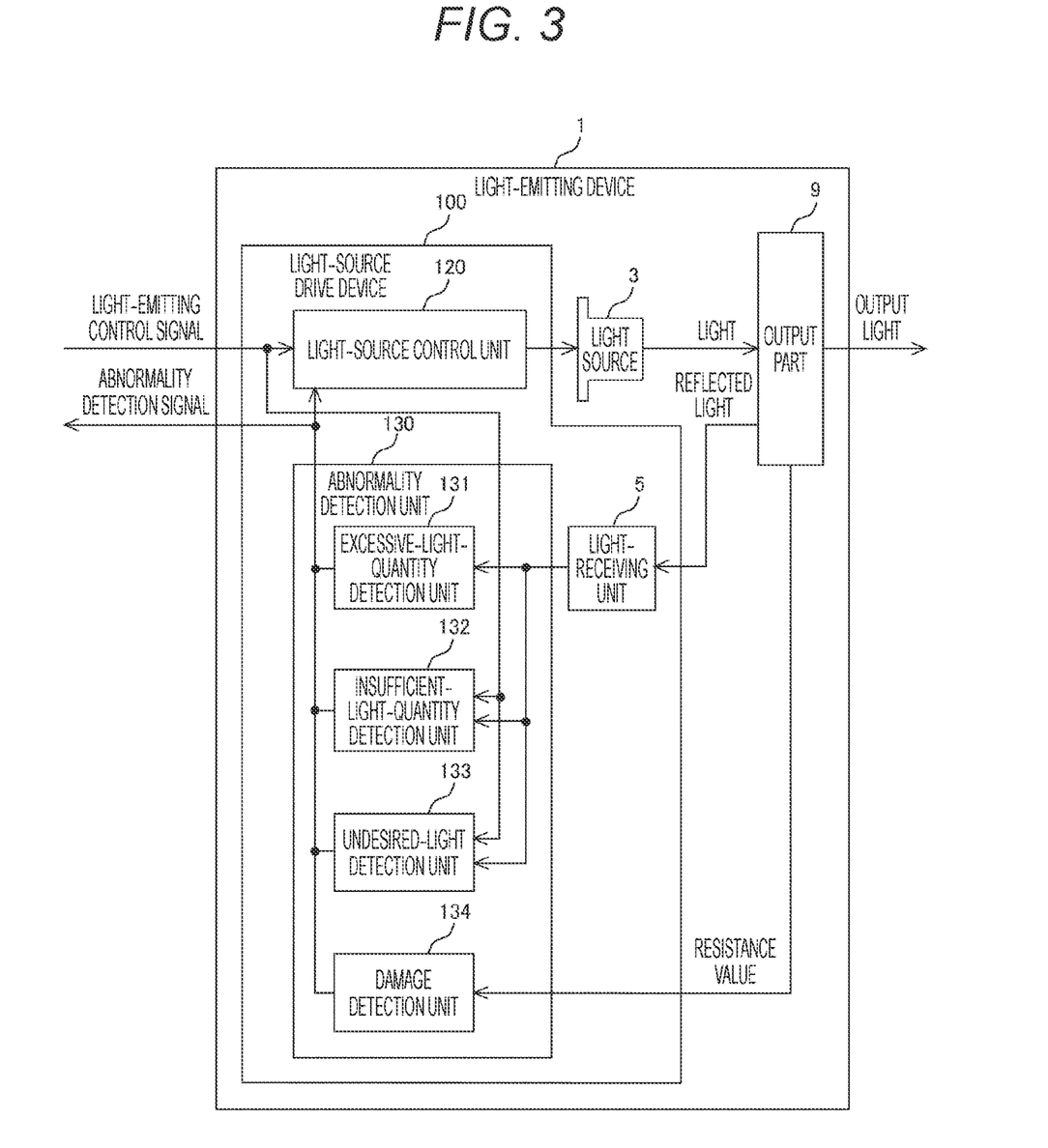
FIG. 3 is a block diagram of an exemplary configuration of a light-emitting device according to a second embodiment of the present disclosure.

FIG. 3 is a block diagram of an exemplary configuration of a light-emitting device according to the second embodiment of the present disclosure. The light-emitting device 1 of FIG. 3 is different from the light-emitting device 1 described in FIG. 2 in that an output part 9 is provided instead of an output part 4 and additionally a damage detection unit 134 is provided.

The output part 9 has a damage detection pattern for detecting damage in the output part 9, disposed thereon. The damage detection pattern can include a conductor disposed on the surface of the output part 9. For example, a linearly formed damage detection pattern is disposed at the peripheral portion of the output part 9. In a case where the damage detection pattern is disconnected due to, for example, a chipped end portion, damage in the output part 9 can be detected. For example, monitoring the resistance value of the damage detection pattern enables detection of disconnection of the damage detection pattern. The configuration of the output part 9 will be described in detail later.

The damage detection unit 134 detects damage in the output part 9. By comparing the resistance value of the damage detection pattern with a predetermined threshold, the damage detection unit 134 can detect the damage in the output part 9. Specifically, a current value is acquired with current flowing in the damage detection pattern, and disconnection of the damage detection pattern can be detected in a case where the current value falls below a predetermined threshold. In a case where damage in the output part 9 is detected, the damage detection unit 134 generates an abnormality detection signal and outputs the abnormality detection signal to the light-source control unit 120.

[Configuration of Output Part]

Figure 4:
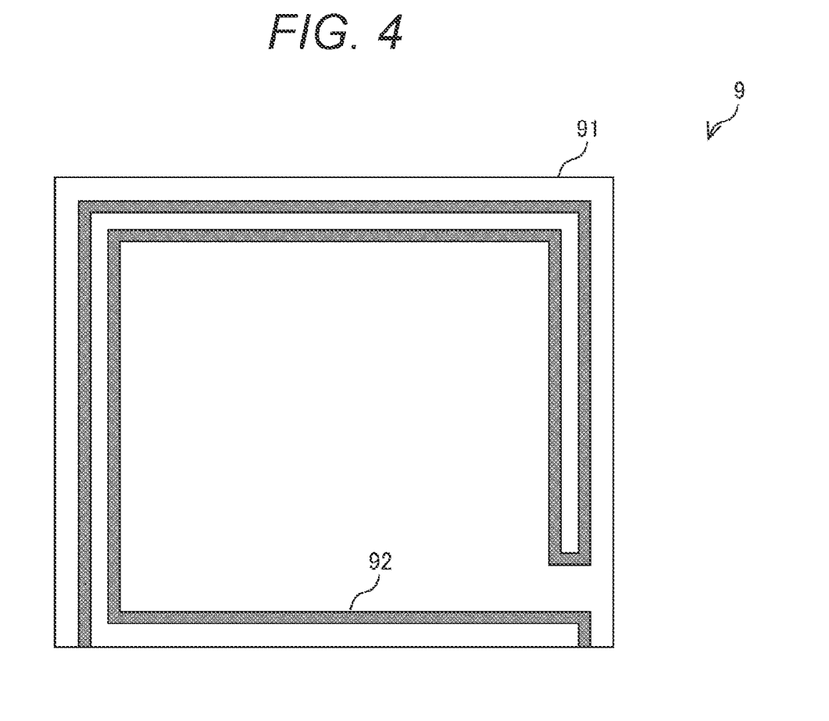
FIG. 4 illustrates an exemplary configuration of an output part according to the second embodiment of the present disclosure.

FIG. 4 illustrates an exemplary configuration of the output part according to the second embodiment of the present disclosure. FIG. 4 illustrates an exemplary configuration of the output part 9. The output part 9 of FIG. 4 includes a diffuser 91 and a damage detection pattern 92. The damage detection pattern 92 includes a transparent conductor and is disposed along the peripheral portion of the diffuser 91. For the damage detection pattern 92, for example, indium tin oxide (ITO) can be used. The damage detection unit 134 monitors the change in the resistance value of the damage detection pattern 92 while supplying current to the damage detection pattern 92, and thus, the disconnection of the damage detection pattern 92 can be detected.

The remaining configuration of the light-emitting device 1 is similar to the configuration of the light-emitting device 1 described in the first embodiment of the present disclosure, and thus the description thereof will be omitted.

As described above, the light-emitting device 1 according to the second embodiment of the present disclosure includes the output part 9 having the damage detection pattern and the damage detection unit 134, and thus the damage in the output part 9 can be detected. Therefore, damage in the output part can be doubly detected by the insufficient-light-quantity detection unit 132 and the damage detection unit 134, and an enhancement in safety can be made.

3. Third Embodiment

The light-emitting device 1 according to the first embodiment includes one light-receiving unit 5. In contrast to this, a light-emitting device 1 according to a third embodiment of the present disclosure is different from that according to the first embodiment in that a plurality of light-receiving units 5 is provided.

[Light-Emitting Device]

Figure 5:
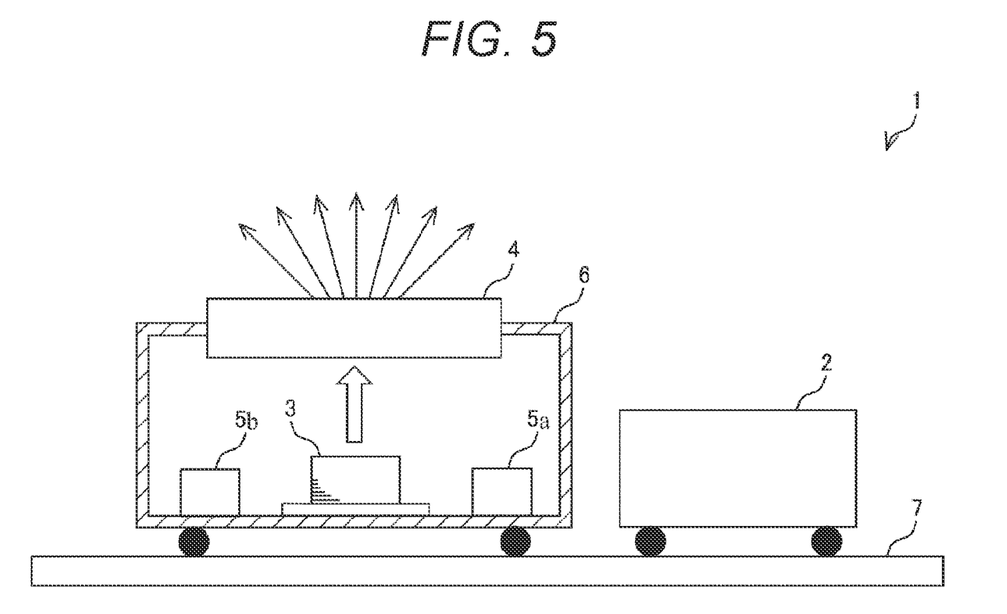
FIG. 5 illustrates an exemplary configuration of a light-emitting device according to a third embodiment of the present disclosure.

FIG. 5 illustrates an exemplary configuration of the light-emitting device according to the third embodiment of the present disclosure. The light-emitting device 1 of FIG. 5 is different from the light-emitting device 1 described in FIG. 1 in that two light-receiving units 5a and 5b are provided.

The light-receiving units 5a and 5b are disposed at different positions in a housing 6 and receive reflected light from an output part 4. Furthermore, an abnormality detection unit 130 according to the third embodiment of the present disclosure detects an abnormality, on the basis of the laser light received by the light-receiving units 5a and 5b. Therefore, even in a case where either the light-receiving unit 5a or the light-receiving unit 5b is damaged, the abnormality in the light-emitting device 1 can be detected.

Note that the configuration of the light-emitting device 1 is not limited to this example. For example, three or more light-receiving units 5 can be provided.

The remaining configuration of the light-emitting device 1 is similar to the configuration of the light-emitting device 1 described in the first embodiment of the present disclosure, and thus the description thereof will be omitted.

As described above, the light-emitting device 1 according to the third embodiment of the present disclosure includes a plurality of light-receiving units that receives laser light. Therefore, the safety of the light-emitting device 1 can be further enhanced.

4. Fourth Embodiment

In the light-emitting device 1 according to the first embodiment, the light-receiving unit 5 detects the laser light reflected from the output part 4. In contrast to this, a light-emitting device 1 according to a fourth embodiment of the present disclosure is different from that according to the first embodiment in that laser light having passed through an output part 4 is detected.

[Light-Emitting Device]

Figure 6:
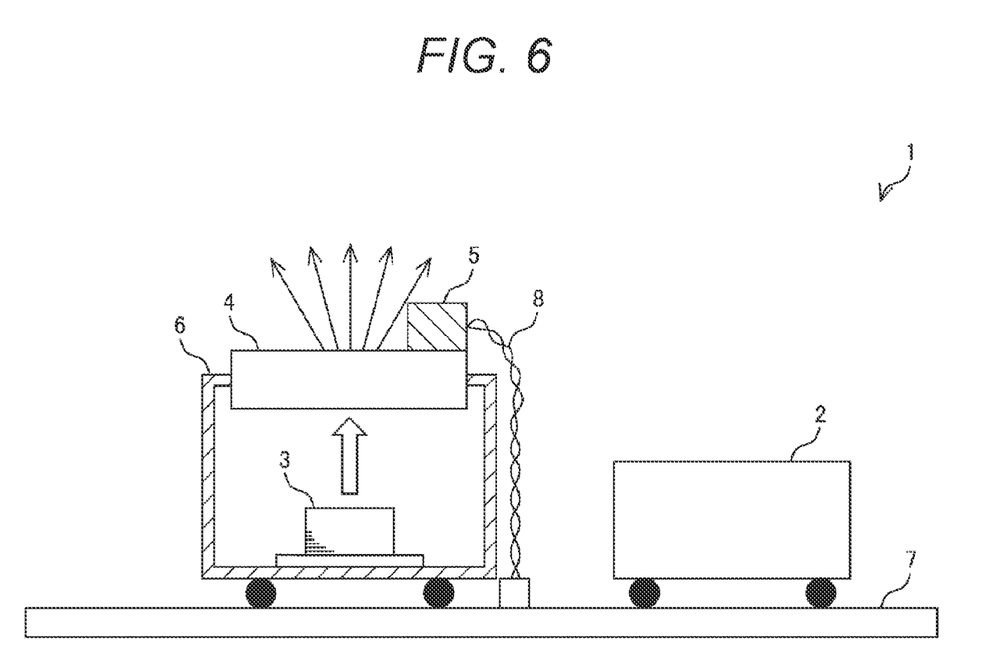
FIG. 6 illustrates an exemplary configuration of a light-emitting device according to a fourth embodiment of the present disclosure.

FIG. 6 illustrates an exemplary configuration of the light-emitting device according to the fourth embodiment of the present disclosure. The light-emitting device 1 of FIG. 6 is different from the light-emitting device 1 described in FIG. 1 in that a light-receiving unit 5 is disposed outside the output part 4.

The light-receiving unit 5 of FIG. 6 is disposed adjacently to a face of the output part 4 different from a face of the output part 4 that laser light from a light source 3 enters. The light-receiving unit 5 receives, from the light source 3, the laser light having passed through the output part 4. Furthermore, the light-receiving unit 5 of FIG. 6 is connected to a substrate 7 through an electric wire 8 and a connector. In a case where the light source 3, the output part 4, and a housing 6 are integrally formed for miniaturization of the light-emitting device 1, the light-receiving unit 5 is disposed outside the output part 4, so that the laser light from the light source 3 can be received.

The remaining configuration of the light-emitting device 1 is similar to the configuration of the light-emitting device 1 described in the first embodiment of the present disclosure, and thus the description thereof will be omitted.

As described above, in the light-emitting device 1 according to the fourth embodiment of the present disclosure, reception of the laser light having passed through the output part 4 enables detection of abnormality in the light-emitting device 1.

5. Fifth Embodiment

In the light-emitting device 1 according to the first embodiment, the abnormality detection signals generated by the excessive-light-quantity detection unit 131, the insufficient-light-quantity detection unit 132, and the undesired-light detection unit 133 in the abnormality detection unit 130 are output together to, for example, the light-source control unit 120. In contrast to this, a light-emitting device 1 according to a fifth embodiment of the present disclosure is different from that according to the first embodiment in that an excessive-light-quantity detection unit 131, an insufficient-light-quantity detection unit 132, and an undesired-light detection unit 133 output abnormality detection signals individually to, for example, a light-source control unit 120.

[Configuration of Light-Emitting Device]

Figure 7:
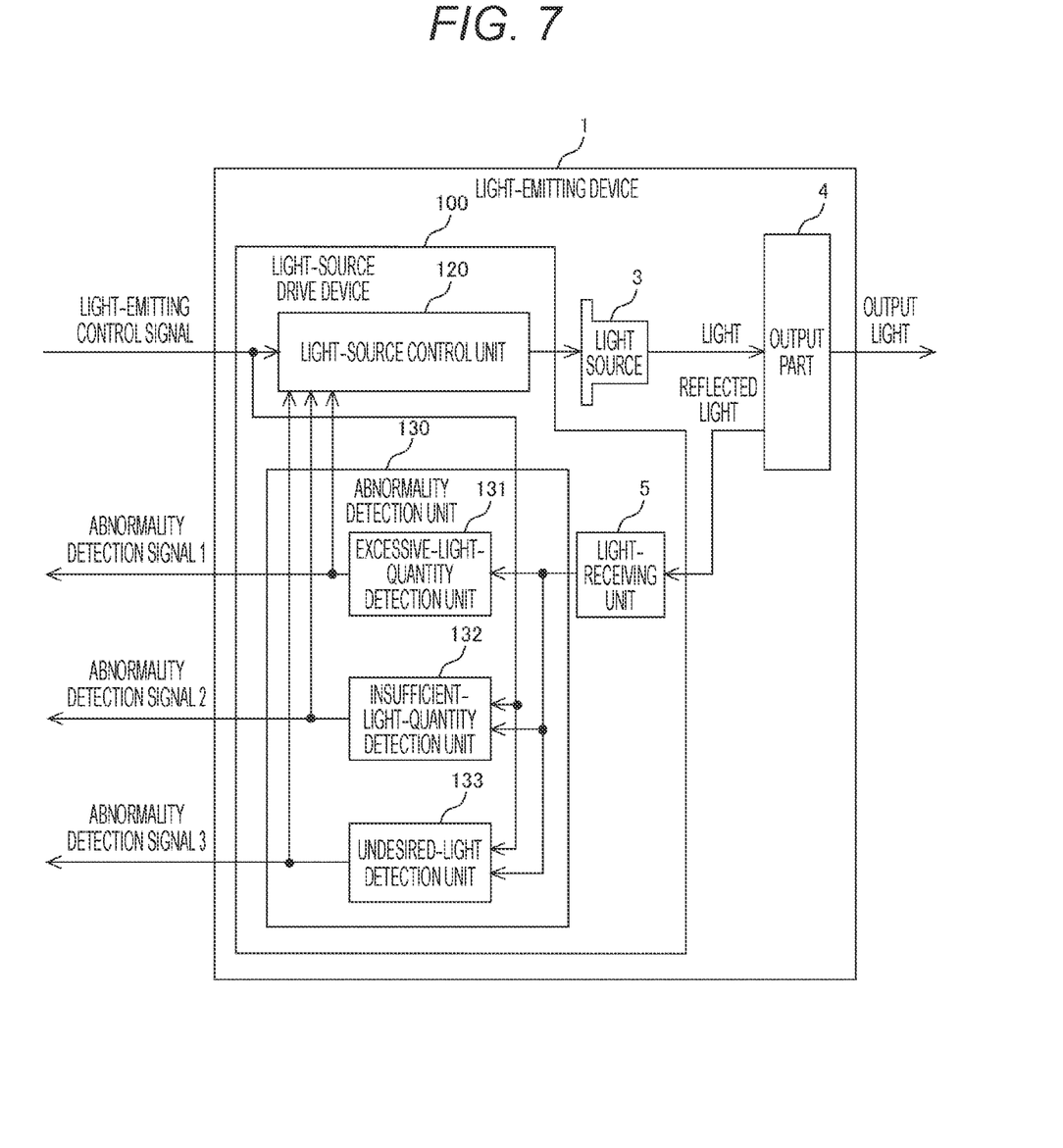
FIG. 7 is a block diagram of an exemplary configuration of a light-emitting device according to a fifth embodiment of the present disclosure.

FIG. 7 is a block diagram of an exemplary configuration of the light-emitting device according to the fifth embodiment of the present disclosure. The light-emitting device 1 of FIG. 7 is different from the light-emitting device 1 described in FIG. 1 in that the excessive-light-quantity detection unit 131, the insufficient-light-quantity detection unit 132, and the undesired-light detection unit 133 output abnormality detection signals 1 to 3, respectively.

The excessive-light-quantity detection unit 131 of FIG. 7 generates the abnormality detection signal 1 and outputs the abnormality detection signal 1 to the light-source control unit 120 and to an external circuit. Similarly, the insufficient-light-quantity detection unit 132 of FIG. 7 generates the abnormality detection signal 2 and outputs the abnormality detection signal 2 to, for example, the light-source control unit 120. The undesired-light detection unit 133 of FIG. 7 generates the abnormality detection signal 3 and outputs the abnormality detection signal 3 to, for example, the light-source control unit 120. Therefore, the type of abnormality detected by the abnormality detection unit 130 can be grasped. Furthermore, the light-source control unit 120 can perform processing, on the basis of the detected abnormality.

The remaining configuration of the light-emitting device 1 is similar to the configuration of the light-emitting device 1 described in the first embodiment of the present disclosure, and thus the description thereof will be omitted.

As described above, the light-emitting device 1 according to the fifth embodiment of the present disclosure outputs a signal for each type of detected abnormality. Therefore, the convenience of the light-emitting device 1 can be enhanced.

6. Sixth Embodiment

In the light-emitting device 1 according to the first embodiment, the excessive-light-quantity detection unit 131, the insufficient-light-quantity detection unit 132, and the undesired-light detection unit 133 in the abnormality detection unit 130 detect abnormality at all times. In contrast to this, a light-emitting device 1 according to a sixth embodiment of the present disclosure is different from that according to the first embodiment in that any of an excessive-light-quantity detection unit 131, an insufficient-light-quantity detection unit 132, and an undesired-light detection unit 133 is selected and detection of abnormality is performed.

[Configuration of Light-Emitting Device]

Figure 8:
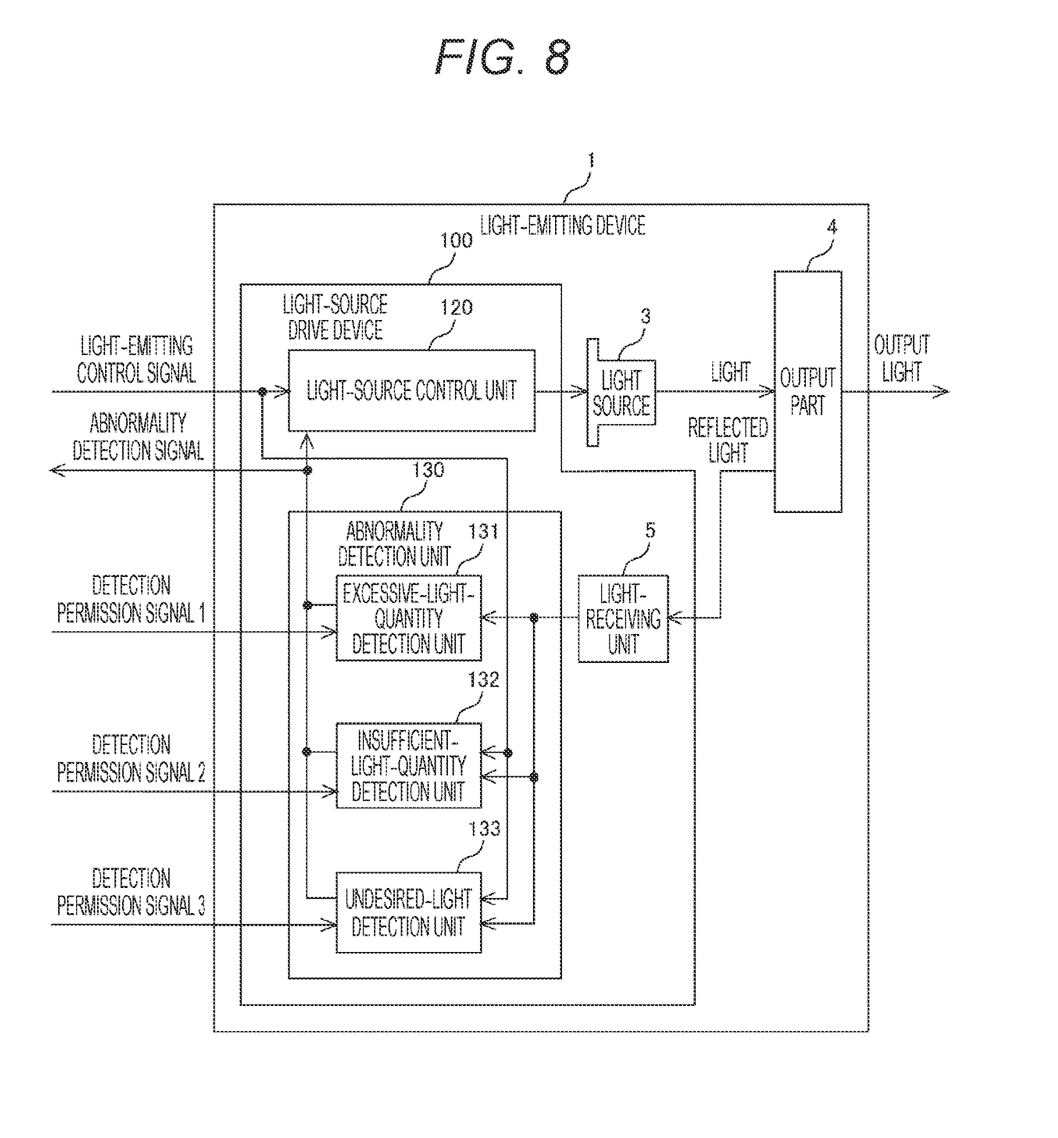
FIG. 8 is a block diagram of an exemplary configuration of a light-emitting device according to a sixth embodiment of the present disclosure.

FIG. 8 is a block diagram of an exemplary configuration of the light-emitting device according to the sixth embodiment of the present disclosure. The light-emitting device 1 of FIG. 8 is different from the light-emitting device 1 described in FIG. 1 in that a detection permission signal is input to each of the excessive-light-quantity detection unit 131, the insufficient-light-quantity detection unit 132, and the undesired-light detection unit 133.

Detection permission signals 1 to 3 are input from an external control circuit, respectively, to the excessive-light-quantity detection unit 131, the insufficient-light-quantity detection unit 132, and the undesired-light detection unit 133 of FIG. 8. The detection permission signals 1 to 3 each correspond to a so-called enabling signal. For example, the detection permission signals 1 to 3 each having a value of "1" enable the excessive-light-quantity detection unit 131 and the like to perform detection of abnormality. The detection permission signals 1 to 3 each having a value of "0" enable the excessive-light-quantity detection unit 131 and the like to stop the detection of abnormality. Therefore, detection of abnormality can be performed by a desired detection unit selected from the excessive-light-quantity detection unit 131, the insufficient-light-quantity detection unit 132, and the undesired-light detection unit 133.

The remaining configuration of the light-emitting device 1 is similar to the configuration of the light-emitting device 1 described in the first embodiment of the present disclosure, and thus the description thereof will be omitted.

As described above, the light-emitting device 1 according to the sixth embodiment of the present disclosure enables the external control circuit to perform control such that the excessive-light-quantity detection unit 131, the insufficient-light-quantity detection unit 132, and the undesired-light detection unit 133 perform detection of abnormality. Therefore, the convenience of the light-emitting device 1 can be enhanced.

7. Application to Camera

The technology according to the present disclosure (present technology) can be applied to various products. For example, the present technology may be achieved as a light-emitting device that is mounted on an image pickup device, such as a camera.

Figure 9:
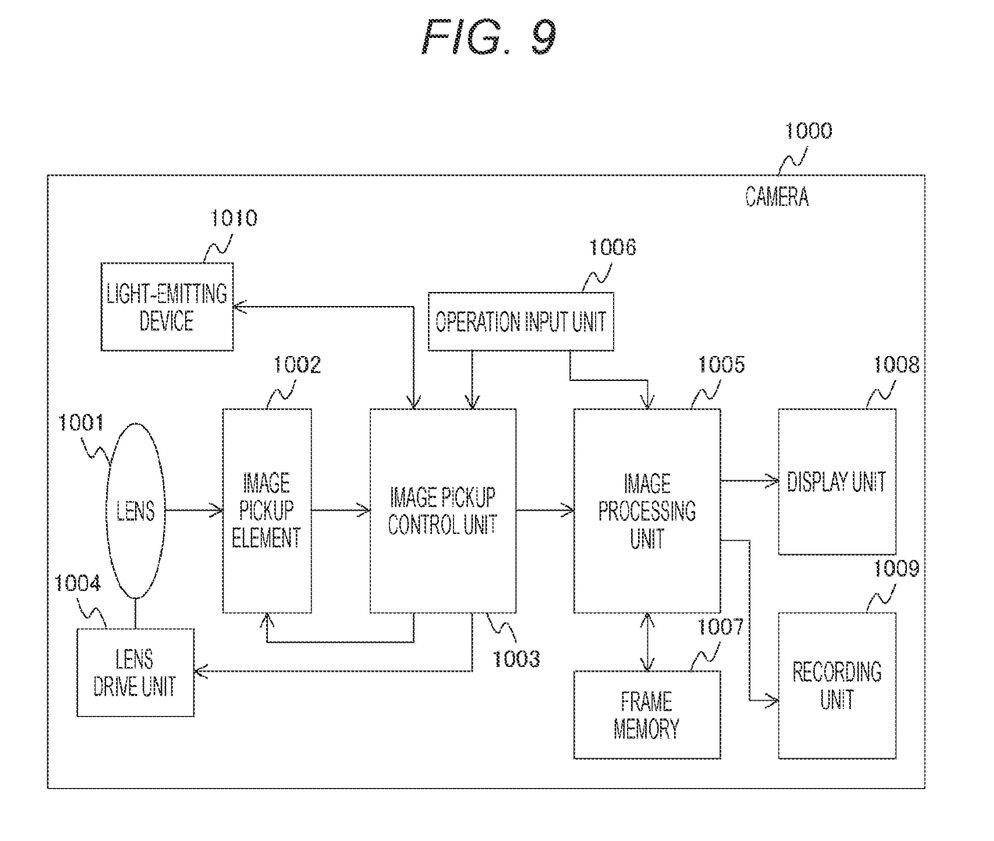
FIG. 9 is a block diagram of an exemplary schematic configuration of a camera that is an exemplary image pickup device to which the present disclosure can be applied.

FIG. 9 is a block diagram of an exemplary schematic configuration of a camera that is an exemplary image pickup device to which the present technology can be applied. The camera 1000 of FIG. 9 includes a lens 1001, an image pickup element 1002, an image pickup control unit 1003, a lens drive unit 1004, an image processing unit 1005, an operation input unit 1006, a frame memory 1007, a display unit 1008, a recording unit 1009, and a light-emitting device 1010.

The lens 1001 is the image pickup lens of the camera 1000. The lens 1001 condenses light from a subject and causes the light to enter the image pickup element 1002, to be described later, resulting in formation of the image of the subject.

The image pickup element 1002 is a semiconductor element that captures the light, from the subject, condensed by the lens 1001. The image pickup element 1002 generates an analog image signal corresponding to irradiated light, and converts the analog image signal into a digital image signal and outputs the digital image signal.

The image pickup control unit 1003 controls capturing in the image pickup element 1002. The image pickup control unit 1003 generates and outputs a control signal to the image pickup element 1002, to control the image pickup element 1002. Furthermore, the image pickup control unit 1003 enables autofocus in the camera 1000, on the basis of the image signal output from the image pickup element 1002. Here, the autofocus is a system of performing automatic adjustment with detection of the focal position of the lens 1001. As the autofocus, used can be a technique of detecting an on-sensor phase difference with phase detection pixels disposed in the image pickup element 1002 to detect the focal position (on-sensor phase detection autofocus). Furthermore, adopted can be a technique of detecting, as the focal position, the position at which the image is highest in contrast (contrast detection autofocus). The image pickup control unit 1003 adjusts the position of the lens 1001 through the lens drive unit 1004, on the basis of detected focal position, to achieve autofocus. Note that the image pickup control unit 1003 can be achieved by, for example, a digital signal processor (DSP) equipped with firmware.

The lens drive unit 1004 drives the lens 1001, on the basis of control from the image pickup control unit 1003. The lens drive unit 1004 changes the position of the lens 1001 with its built-in motor, so that the lens 1001 can be driven.

The image processing unit 1005 performs processing to the image signal generated by the image pickup element 1002. Examples of the processing include demosaicing of generating an image signal of an insufficient color among respective image signals corresponding to red, green, and blue in each pixel, noise reduction of removing noise from an image signal, coding of an image signal, and the like. The image processing unit 1005 can be achieved by, for example, a microcomputer equipped with firmware.

The operation input unit 1006 receives an operation input from a user of the camera 1000. For the operation input unit 1006, for example, a push button or a touch panel can be used. The operation input received by the operation input unit 1006 is transferred to the image pickup control unit 1003 or to the image processing unit 1005. After that, started is processing corresponding to the operation input, such as processing of capturing a subject, or the like.

The frame memory 1007 is a memory that stores a frame that is an image signal for one screen. The frame memory 1007 is controlled by the image processing unit 1005, so that the frame memory 1007 retains a frame in a flow of image processing.

The display unit 1008 displays an image processed by the image processing unit 1005. For the display unit 1008, for example, a liquid crystal panel can be used.

The recording unit 1009 records the image processed by the image processing unit 1005. For the recording unit 1009, for example, a memory card or a hard disk can be used.

The light-emitting device 1010 irradiates a subject with laser light for measurement of the distance to the subject. Furthermore, the image pickup control unit 1003 further controls the light-emitting device 1010 and measures the distance to the subject. Measurement of the distance to the subject in the camera 1000 can be performed as follows: First, the image pickup control unit 1003 controls the light-emitting device 1010 such that laser light is output. Next, the image pickup element 1002 detects the laser light reflected from the subject. Next, the image pickup control unit 1003 measures the time from the output of the laser light from the light-emitting device 1010 to the detection of the laser light in the image pickup element 1002, to calculate the distance to the subject.

The camera to which the present invention can be applied has been described above. The present technology can be applied to the light-emitting device 1010 in the configuration described above. Specifically, the light-emitting device 1 described in FIG. 1 can be applied to the light-emitting device 1010. Application of the light-emitting device 1 to the light-emitting device 1010 enables detection of abnormality in the light-emitting device 1. Thus, an enhancement can be made in safety at the time of measurement of distance.

Note that the camera has been exemplarily described herein, but the technology according to the present invention may be applied to, for example, a mobile terminal or an automated guided vehicle.

Finally, the description of each embodiment of the present disclosure is just exemplary, and thus the present disclosure is not limited to the embodiments. Needless to say, various alternations can be made in accordance with, for example, designs for other embodiments without departing from the scope of the technical idea according to the present disclosure.

Furthermore, the steps in processing described in each embodiment may be regarded as a method including a series of the steps. In addition, the steps may be regarded as a program for causing a computer to perform the series of the steps or as a recording medium storing the program. As the recording medium, for example, a compact disc (CD), a digital versatile disc (DVD), a memory card, or the like can be used.

Note that the present technology can have the following configurations.

(1) A light-source drive device including:
a light-source control unit configured to control light emission of a light source;
a light-receiving unit configured to receive light from the light source through an output part allowing outward output of light of the light source; and
an abnormality detection unit configured to detect an abnormality of the light output from the output part, on the basis of the received light.

(2) The light-source drive device according to (1) above, in which the abnormality detection unit detects the abnormality during the light emission of the light source by the light-source control unit.

(3) The light-source drive device according to (2) above, in which the abnormality detection unit detects the abnormality in a case where a quantity of the received light exceeds a predetermined threshold.

(4) The light-source drive device according to (2) above, in which the abnormality detection unit detects the abnormality in a case where a quantity of the received light falls below a predetermined threshold.

(5) The light-source drive device according to (1) above, in which the abnormality detection unit detects the abnormality when the light emission of the light source is stopped by the light-source control unit.

(6) The light-source drive device according to (5) above, in which the abnormality detection unit detects the abnormality in a case where a quantity of the received light exceeds a predetermined threshold.

(7) The light-source drive device according to any of (1) to (6) above, in which the abnormality detection unit causes the light-source control unit to stop the light emission when the abnormality is detected.

(8) The light-source drive device according to any of (1) to (7) above, in which the light-receiving unit receives the light from the light source reflected from the output part.

(9) The light-source drive device according to any of (1) to (7) above, in which the light-receiving unit receives the light from the light source transmitted through the output part.

(10) The light-source drive device according to any of (1) to (9) above, including a plurality of the light-receiving units, in which
the abnormality detection unit detects the abnormality, on the basis of the light received by the plurality of light-receiving units.

(11) A light-emitting device including:
a light source;
an output part allowing outward output of light of the light source;
a light-source control unit configured to control light emission of the light source;
a light-receiving unit configured to receive light from the light source through the output part; and
an abnormality detection unit configured to detect an abnormality of the light output from the output part, on the basis of the received light.

(12) The light-emitting device according to (11) above, in which the output part transmits the light from the light source through the output part and converts the light from the light source into diffused light.

REFERENCE SIGNS LIST

1 Light-emitting device
3 Light source
4, 9 Output part
5, 5a, 5b Light-receiving unit
91 Diffuser
92 Damage detection pattern
100 Light-source drive device
120 Light-source control unit
130 Abnormality detection unit
131 Excessive-light-quantity detection unit
132 Insufficient-light-quantity detection unit
133 Undesired-light detection unit
134 Damage detection unit
1000 Camera
1003 Image pickup control unit
1010 Light-emitting device

The invention claimed is:
1. A light-source drive device comprising:
a light-source control unit configured to control light emission of a light source;

a light-receiving unit configured to receive light from the light source through an output part that allows outward output of light of the light source; and an abnormality detection unit configured to detect an abnormality of the light output from the output part, based on the received light.

2. The light-source drive device according to claim 1, wherein the abnormality detection unit is further configured to detect the abnormality during the light emission of the light source by the light-source control unit.

3. The light-source drive device according to claim 2, wherein the abnormality detection unit is further configured to detect the abnormality in a case where a quantity of the received light exceeds a specific threshold.

4. The light-source drive device according to claim 2, wherein the abnormality detection unit is further configured to detect the abnormality in a case where a quantity of the received light falls below a specific threshold.

5. The light-source drive device according to claim 1, wherein the abnormality detection unit is further configured to detect the abnormality when the light emission of the light source is stopped by the light-source control unit.

6. The light-source drive device according to claim 5, wherein the abnormality detection unit is further configured to detect the abnormality in a case where a quantity of the received light exceeds a specific threshold.

7. The light-source drive device according to claim 1, wherein the abnormality detection unit is further configured to cause the light-source control unit to stop the light emission when the abnormality is detected.

8. The light-source drive device according to claim 1, wherein the light-receiving unit is further configured to receive the light from the light source reflected from the output part.

9. The light-source drive device according to claim 1, wherein the light-receiving unit is further configured to receive the light from the light source transmitted through the output part.

10. The light-source drive device according to claim 1, comprising a plurality of the light-receiving units, wherein the abnormality detection unit is further configured to detect the abnormality, based on the light received by the plurality of light-receiving units.

11. A light-emitting device comprising:

a light source;

an output part configured to allow outward output of light of the light source;

a light-source control unit configured to control light emission of the light source;

a light-receiving unit configured to receive light from the light source through the output part; and an abnormality detection unit configured to detect an abnormality of the light output from the output part, based on the received light.

12. The light-emitting device according to claim 11, wherein the output part is further configured to:

transmit the light from the light source through the output part, and convert the light from the light source into diffused light.

* * * * *